United States Patent [19]

Alferness et al.

[11] Patent Number: 4,852,960
[45] Date of Patent: Aug. 1, 1989

[54] NARROW-LINEWIDTH RESONANT OPTICAL DEVICE, TRANSMITTER, SYSTEM, AND METHOD

[75] Inventors: Rodney C. Alferness, Holmdel; Charles H. Henry, Skillman; Rudolf F. Kazarinov, Martinsville; Nils A. Olsson, New Providence; Kenneth J. Orlowsky, Middlesex, all of N.J.

[73] Assignee: American Telephone and Telegraph Company, AT&T Bell Laboratories, Murray Hill, N.J.

[21] Appl. No.: 249,212

[22] Filed: Sep. 23, 1988

Related U.S. Application Data

[63] Continuation-in-part of Ser. No. 153,550, Feb. 8, 1988, abandoned, which is a continuation of Ser. No. 24,609, Mar. 11, 1987, abandoned.

[51] Int. Cl.$^4$ .............................................. G02B 6/34
[52] U.S. Cl. ............................. 350/96.19; 350/96.15; 455/612
[58] Field of Search ............. 350/96.11, 96.13, 96.14, 350/96.1, 96.19, 96.29, 96.12; 455/34, 56, 610, 612

[56] References Cited

U.S. PATENT DOCUMENTS 4,312,562  1/1982  Segawa et al. ............... 350/96.14 X
4,669,816  6/1987  Thompson ...................... 350/96.15

OTHER PUBLICATIONS

"Narrow-Band Grating Resonator Filters in InGaAsP-/InP Waveguides", *Applied Physics Letters*, vol. 49, 1986, pp. 125–127, by R. C. Alferness et al.
"Channelled-Substrate Buried-Heterostructure In-GaAsP/InP Laser with Semi-Insulating OMVPE Base Structure and LPE Regrowth", *Electronics Letters*, vol. 22, pp. 869–870, by D. P. Wilt et al.

*Primary Examiner*—John D. Lee
*Assistant Examiner*—Phan Heartney
*Attorney, Agent, or Firm*—Peter A. Businger

[57] ABSTRACT

Highly frequency-selective reflectivity is realized in an optical device including a waveguide and an evanescent-field coupled grating resonator cavity. The device may include a light source and serve as a low-chirp, narrow-linewidth communications laser for use, e.g., for transmission over a fiber having non-negligible dispersion and also in wavelength-multiplexed coherent systems.

23 Claims, 5 Drawing Sheets

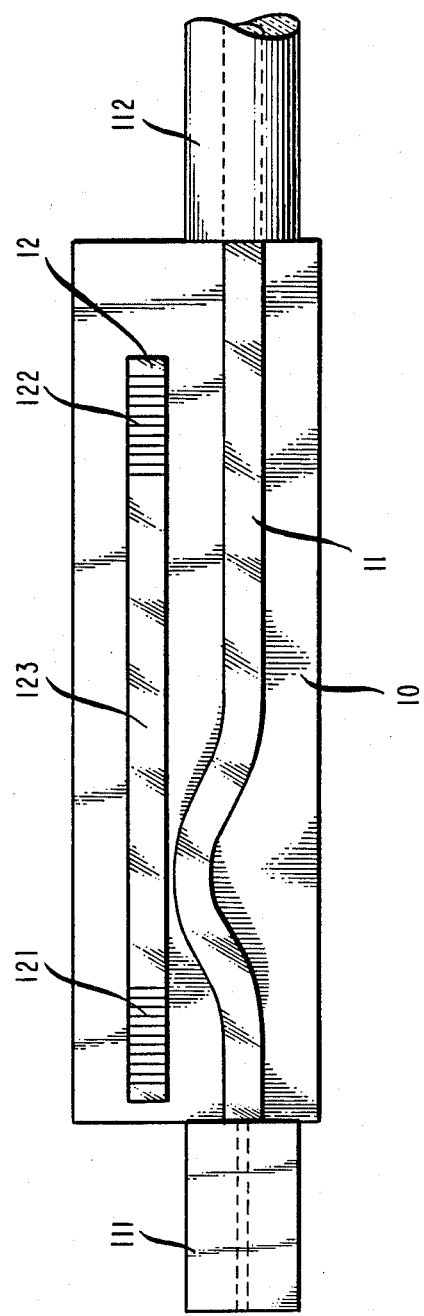

4,852,960

NARROW-LINEWIDTH RESONANT OPTICAL DEVICE, TRANSMITTER, SYSTEM, AND METHOD

This application is a continuation-in-part of application Ser. No. 153,550, filed on Feb. 8, 1988 (abandoned).

TECHNICAL FIELD

The invention is concerned with waveguide-optical devices having frequency-selective characteristics, and with the use of such devices in optical communications.

BACKGROUND OF THE INVENTION

Concomitant with increasing commercial use of fiber-optical communications, there is growing interest in optimized utilization of existing as well as of projected optical communications facilities. To a considerable extent, optimization of utilization depends on the quality of light sources.

For example, single optical fibers typically are used for transmission at frequencies at which there is appreciable frequency dispersion, laser sources are desired having high frequency stability or low "chirp" as pulses are transmitted. And, in the interest of close spacing of communications channels in coherent systems, lasers are desired having narrow linewidth.

One approach to making narrow-linewidth semiconductor lasers is suggested by R. C. Alferness et al., "Narrow-band Grating Resonator Filters in InGaAsP-/InP Waveguides", Applied Physics Letters, Vol. 49 (1986), pp. 125–127. The suggested device includes a resonator filter comprising two diffraction grating sections exhibiting an effective phase shift relative to each other, device operation being understood in terms of a transmission resonance. As compared with the use of a (single) diffraction grating, a relatively short filter device in accordance with the reference achieves frequency selectivity corresponding to that of a much longer ordinary diffraction grating filter.

Further in the interest of simplified device manufacture, a laser design is desired which is readily suited for implementation in the form of hybrid assemblies.

SUMMARY OF THE INVENTION

Devices such as, e.g., low-chirp, narrow-linewidth lasers can be made on the basis of frequency selection resulting from a reflection resonance. Such resonance is conveniently realized in a side-by-side coupling arrangement between waveguides, one of which is equipped with two sections of spatially periodic refractive index variations, such sections being spaced apart by a quarter-wave spacer section. Waveguides typically are substrate supported. Devices of the invention may be monolithic or hybrid, the latter approach involving the assembly of devices from components made from differing materials such as, e.g., Group III-V and Group IV materials. Also within the scope of the invention are optical transmitters, optical communications systems, and an optical communications method, all involving a resonant reflector device.

As an alternative to a quarter-wave ($\lambda/4$, 90-degree) phase shift between resonator sections as resulting in a single-mode resonator, multi-mode resonant optical reflectors can be realized by greater separation of such sections. In this case, preferred separation is greater than the Bragg length (i.e., the reciprocal of the coupling constant of a grating), resulting in more than one resonant reflection within the reflection band of the reflector sections. Multi-mode reflectors are advantageous in that, in cases where there is additional optical loss due to the presence of a waveguide grating, increased separation between grating sections results in higher-Q resonators having more narrow reflection resonances. When a multi-mode resonant reflector is coupled to a laser, each of the resonances is capable of providing feedback to the laser, and the laser will operate with narrow linewidth at a single frequency near one such resonance.

BRIEF DESCRIPTION OF THE DRAWING

FIG. 10 is a schematic representation of a reflector-filter device embodiment of the invention in which waveguide grating sections are spaced apart for multi-mode device capability.

DETAILED DESCRIPTION

Figure 1:
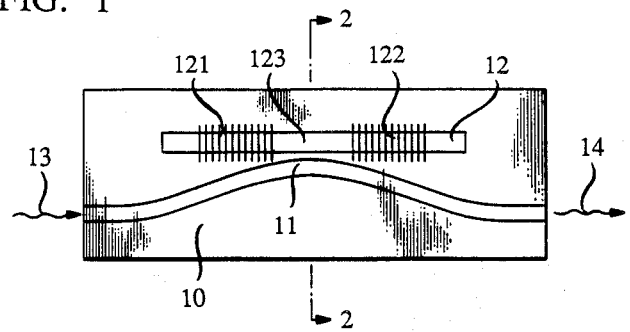
FIG. 1 is a schematic representation of a reflector device embodiment of the invention.

FIG. 1 shows substrate 10, first waveguide 11, second waveguide 12 with first grating portion 121, second grating portion 122, and spacer portion 123 which separates the first grating portion from the second grating portion such that a quarter-wave shift is realized across the spacer portion. The first waveguide is in side-by-side optical coupling relationship with the second optical waveguide; optical coupling is by evanescent fields. Shown further are input radiation 13 and output radiation 14 as applicable to preferred device operation, and without precluding further radiation output from waveguide 12. First-order gratings are preferred; however, the user of higher-order gratings is not precluded.

There are several ways in which grating and spacer portions can be made, one being by means of a spacer portion amounting to a slip in the corrugation. More conveniently, the two grating portions are made coherent as resulting from lithographically defining a length of grating encompassing both portions, followed by etching exclusive of a spacer portion. Achievement of a quarter-wave shift in this fashion depends on a number of parameters such as, e.g., the type of grating, the depth to which a grating is etched, and the length of the spacer portion. For example, it has been determined that for a grating whose grooves have vertical walls and flat bottoms and whose ridges have the same width as its grooves, the length of a preferred spacer portion is equal or approximately equal to the Bragg length of the grating (the reciprocal of the grating coupling coefficient).

Figure 2:
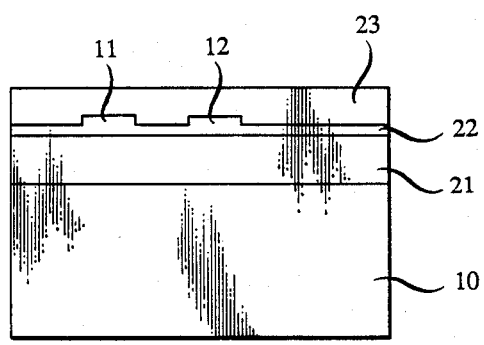
FIG. 2 is a schematic cross section of the device shown in FIG. 1.

FIG. 2 shows waveguides 11 and 12 as rib-shaped features of waveguide layer 22 which is between lower and upper cladding layers 21 and 23.

Functioning of the device in accordance with FIGS. 1 and 2 can be described as follows: The two spaced-apart gratings of waveguide 12 form a resonator cavity for radiation coupled from waveguide 11 into waveguide 12. For an incident field in waveguide 11 at the resonant frequency of the resonator cavity, a strong field builds up in the cavity. Energy accumulated in the cavity is coupled back into waveguide 11 in both directions. At resonance, the reinjected field in the forward direction destructively interferes with the incident field and, provided the resonator loss is dominated by coupling, essentially all power is reflected. When properly designed for a quarter-wave shift, the resonator supports a single, high-Q mode.

Figure 3:
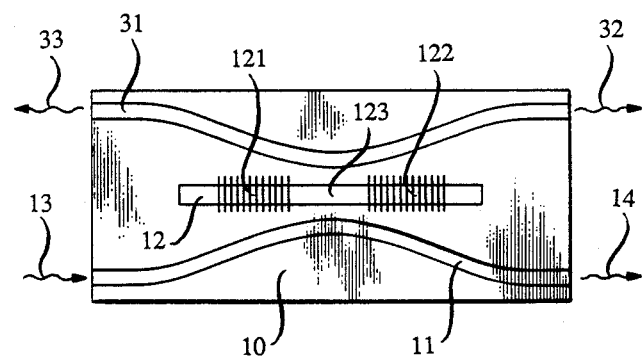
FIG. 3 is a schematic representation of a four-terminal device embodiment of the invention.

FIG. 3 shows, in addition, to features as described above in connection with FIG. 1, waveguide 31 and additional optical outputs 32 and 33 as may be desired, e.g., to provide for additional outputs, for multiplexing onto a common channel (waveguide 31), and, in a receiver application, for removing energy from a common channel.

Figure 4:
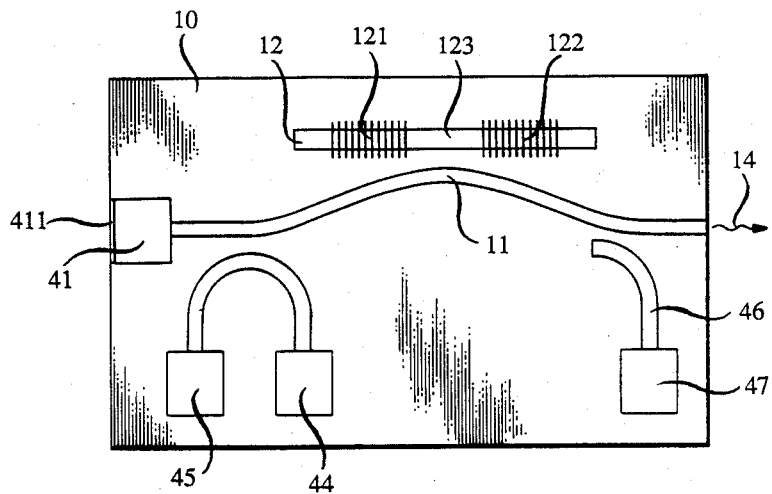
FIG. 4 is a schematic representation of a laser device embodiment of the invention.

FIG. 4 shows, in addition to features as described above in connection with FIG. 1, gain medium 41 with rear-facet 411, waveguide 42 coupled side-by-side to waveguide 11 and leading to optical detectors 44 and 45, and waveguide 46 leading to optical detector 47. Detector 44 can be used to monitor power input to the resonant reflector, detector 45 to monitor reflected power, and detector 47 to monitor transmitted power. The gain medium preferably has negligible internal feedback, with feedback being provided primarily by the external resonator.

Figure 5:
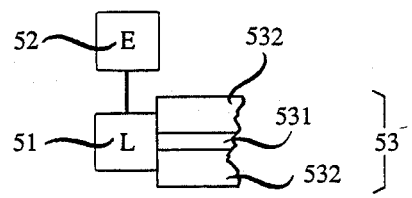
FIG. 5 is a schematic representation of an optical communications transmitter embodiment of the invention.

FIG. 5 shows laser 51 (as shown in detail in FIG. 4), electronic unit 52 electrically connected to laser 51 and designed to operate and modulate the laser, and optical fiber 53 comprising core portion 531 and cladding portion 532. Coupling to the optical fiber may be at the resonator reflector or at the mirrored laser facet.

Figure 6:
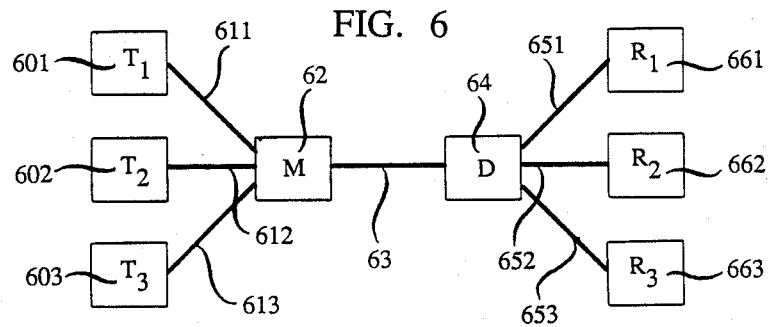
FIG. 6 is a schematic representation of an optical communications system embodiment of the invention.

FIG. 6 shows transmitters 601, 602, and 603 for operation at respective different wavelengths $\lambda_1$, $\lambda_2$, and $\lambda_3$, such transmitters being as shown in FIG. 5. Optical fibers 611, 612, and 613 connect the transmitters to multiplexer 62 to which optical transmission line 63 is connected. Transmission line 63 is connected also to demultiplexer 64 which, under operating conditions, separates signals at wavelengths $\lambda_1$, $\lambda_2$, and $\lambda_3$ for further transmission over respective optical fibers 651, 652, and 653 to respective receivers 661, 662, and 663.

Figure 7:
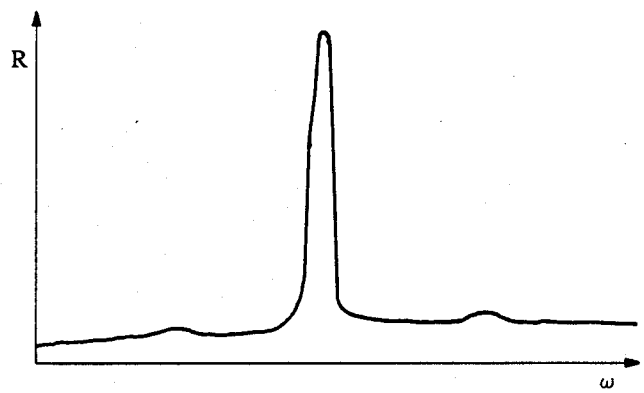
FIG. 7 is a schematic diagram of reflected power as a function of frequency as may be helpful in appreciating the characteristics of the device of FIG. 1.

FIG. 7 shows reflected power R as a function of optical frequency $\omega$ for an idealized device in accordance with FIG. 1, such device being characterized by a narrow reflection resonance.

Figure 8:
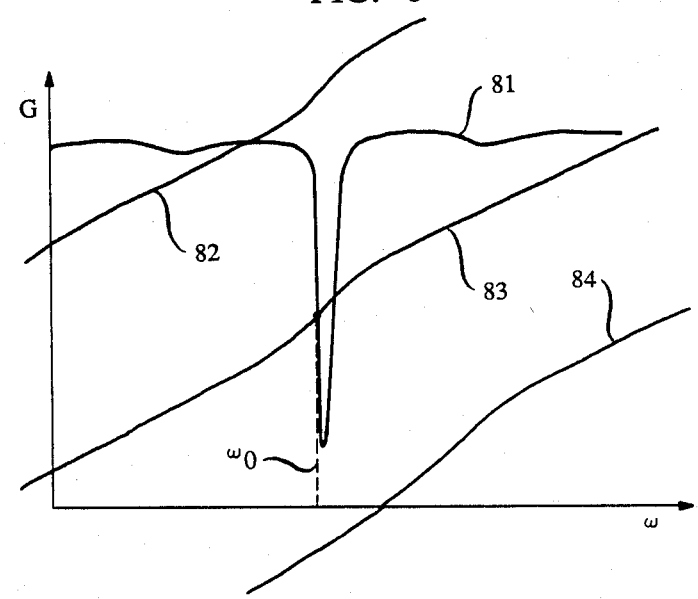
FIG. 8 is a schematic diagram of gain as a function of optical frequency as may be helpful in appreciating the characteristics of the device of FIG. 4.

FIG. 8 shows a curve 81 corresponding to gain-loss equality for an idealized laser in accordance with FIG. 4, the steep and narrow minimum being caused by the presence of the resonant reflector. Also shown are phase curves 82, 83, 84 corresponding to round-trip phase of $2\pi(N-1)$, $2\pi N$, and $2\pi(N+1)$, where N denotes an integer.

It is readily appreciated that there is little change in laser operating frequency (the abscissa $\omega_o$ of the lowest point of intersection of a curve 82, 83, 84 with curve 81) when curves 82, 83, and 84 are subject to translation as may be due, e.g., to temperature change during device operation. Preferably, in the interest of preventing mode hopping, and also in the interest of positive control over wavelength, linewidth, and chirp, means are provided for controlling the laser operating point. This may involve active temperature control during device operation as may be based on monitored power, e.g., by means of detectors as shown in FIG. 3. Especially in the case of a hybrid laser, temperature control may be effective as applied to a laser assembly as a whole. Alternatively, local heating or cooling may be applied, e.g., to the gain medium or to the resonator. Instead, or in addition to temperature control, it is also possible to stabilize laser operation by other means which affect refractive index in the resonant reflector. Among such means are the inclusion and control of a liquid-crystal material, of an electro-optic material, or of carrier injection in a semiconductor material.

Figure 9:
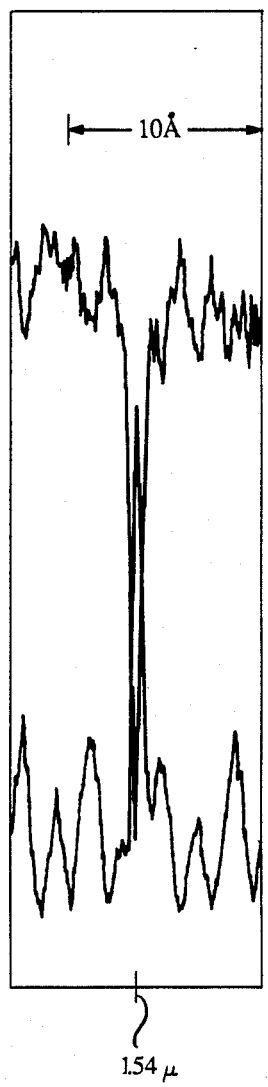
FIG. 9 is a graphic representation of power transmitted and power reflected as experimentally determined as a function of wavelength for a device as shown in FIG. 1.

FIG. 9 shows power transmission curve 91 and power reflection curve 92 as experimentally determined for a device as shown in FIGS. 1 and 2 and as further described in Example 1 below. The reflection peak is centered at a wavelength of approximately 1.54 micrometer, and the width of the reflection peak is approximately 0.35 Angstrom.

FIG. 10 shows substrate 10, first waveguide 11, second waveguide 12 with first grating portion 121, second grating portion 122, and spacer portion 123 which separates such grating portions by a distance which is greater than their Bragg length. Attached to substrate 10 and aligned with waveguide 11 are laser 111 and optical fiber 112; preferably, the distance between laser 111 and the coupling region between waveguides 11 and 12 is kept short, e.g., by asymmetric placement of grating sections 121 and 122 relative to such coupling region.

Devices of the invention may be made as monolithic devices in the sense that complete optical paths including light sources are produced by one and the same sequence of layer deposition and patterning steps. In this respect, Group III–V compound materals processing presents a particularly well-developed choice. Alternatively, hybrid devices may be preferred in which compound materials are used primarily for an amplifying (active) device portion, passive waveguides (including resonant reflector waveguides) being implemented more economically by using a simpler technology such as, e.g., silicon device processing. Such hybrid approach may have further advantages in that separately manufactured device components can be individually tested prior to assembly; on the other hand, there then arises the need for sufficiently accurate alignment of components and their mutual attachment. Such alignment and attachment is involved, e.g., when a laser is made by combining an indium phosphide laser diode with a silicon chip resonant reflector. In commercial production, alignment may be facilitated by matching surface features on components to be joined, and such features can be produced by selective surface etching.

While waveguides shown in FIGS. 1–4 are made side-by-side on a substrate, stacking of waveguides as may be defined in sequentially deposited layers is not precluded. Still, side-by-side placement of waveguides is considered to offer advantages, e.g., with respect to ease of manufacture, and also, in the interest of effective evanescent-field coupling, with respect to refractive index matching between waveguides.

Considered as a key feature of the invention is the achievement of narrow linewidth in a reflector device using compact gratings-as contrasted with prior-art devices including long diffraction gratings whose required uniformity is considered as so difficult to achieve as to severely hamper and even preclude commercial production. Another advantage lies in the fact that typically encountered material and temperature inhomogeneities do not broaden the resonance unduly (resonance occurring for that wavelength for which round-trip phase change in the resonator is $2\pi$). As a result, tuning of the resonance does not broaden the resonance.

EXAMPLE 1

A device as schematically depicted in FIGS. 1 and 2 was made on an oxidized silicon chip by standard chemical-vapor-deposition (CVD) processing and photodefined etching of rib waveguides and gratings. Cladding layer 22 was made by depositing silica glass approximately 5 micrometers thick, and waveguide layer 24 by depositing silicon nitride approximately 120 nanometers thick and selectively etching back to a thickness of approximately 110 nanometers to form the rib waveguides. Cladding layer 24 was made by depositing silica glass approximately 0.6 micrometer thick. The width of the rib waveguides was approximately 3 micrometers. First-order gratings having a period of approximately 0.5 micrometer were formed by holographic lithography and etched into the silica glass cladding layer 24. A tunable color-center laser was used to determine power transmission and reflection spectra; the results are as depicted in FIG. 9. Other than silicon nitride as described, phosphosilicate glass represents a convenient choice of waveguide core material.

EXAMPLE 2

A laser was made by butt-coupling the resonant reflector described above in Example 1 to a standard diode light source as described by D. P. Wilt et al., "Channelled-substrate Buried-heterostructure InGaAsP/InP Laser with Semi-insulating OMVPE Base Structure and LPE Regrowth", Electronics Letter, Vol. 22, pp. 869-870. An anti-reflection coating was applied to the laser facet coupled to the resonant reflector. The laser was found to operate at a wavelength of approximately 1.54 micrometer and to have a linewidth of approximately 135 kHz, i.e., more than 2 orders of magnitude less than a typical distributed-feedback laser.

What is claimed is:

1. An optical device comprising first and second optical waveguides,
    said first waveguide being designed for optical input and optical output,
    said second waveguide being in side-by-side optical coupling relationship with said first waveguide,
    said second waveguide comprising first and second sections in which effective refractive index varies in a spatially periodic fashion,
    whereby said second waveguide is adapted as a resonator for radiation at a desired wavelength traveling in said first waveguide.

2. The device of claim 1, said first and second sections being in quarter-wave shifted relationship as based on said wavelength.

3. The device of claim 1, said first and second sections being spaced apart by a distance which is greater than the Bragg length of said sections.

4. The device of claim 1, said first and second optical waveguides being substrate-supported.

5. The device of claim 1, further comprising light-emitting means disposed for optical input to said first waveguide.

6. The device of claim 5, said light-emitting means comprising a light-emitting region which consists essentially of a Group III-V material.

7. The device of claim 1, further comprising an optical fiber disposed to receive optical output from said first waveguide.

8. The device of claim 1, said first and second sections comprising diffraction gratings.

9. The device of claim 4, said substrate consisting essentially of silicon.

10. The device of claim 9, said first and second waveguides comprising cladding portions which consist essentially of silica glass.

11. The device of claim 10, said first and second waveguides comprising core portions which consist essentially of silicon nitride.

12. The device of claim 10, said first and second waveguides comprising core portions which consist essentially of phosphosilicate glass.

13. The device of claim 1, said device comprising means for monitoring radiation traveling in said first waveguide.

14. The device of claim 1, said device comprising a third waveguide which is in side-by-side coupling relationship with said second waveguide.

15. An optical transmitter, said transmitter comprising an optical communications laser and means for modulating laser radiation,
    said communications laser comprising an amplifying portion and a reflector portion,
    said reflector portion comprising first and second optical waveguides,
    said first waveguide being designed for optical input and optical output,
    said second waveguide being in side-by-side optical coupling relationship with said first waveguide,
    said second waveguide comprising first and second sections in which effective refractive index varies in a spatially periodic fashion,
    whereby said second waveguide is adapted as a resonator for radiation at a desired wavelength traveling in said first waveguide.

16. An optical communications system, said system comprising an optical transmitter and an optical receiver,
    said transmitter comprising an optical communications laser and means for modulating laser radiation,
    said communications laser comprising an amplifying portion and a reflector portion,
    said reflector portion comprising first and second optical waveguides,
    said first waveguide being designed for optical input and optical output,
    said second waveguide being in side-by-side optical coupling relationship with said first waveguide,
    said second waveguide comprising first and second sections in which effective refractive index varies in a spatially periodic fashion, whereby said second waveguide is adapted as a resonator for radiation at a desired wavelength traveling in said first waveguide.

17. The communications system of claim 16, said communications system comprising a plurality of transmitters designed to emit optical radiation at differing frequencies, and means for multiplexing said optical radiation.

18. A method for transmitting a signal, said method comprising operating an optical transmitter,
    said optical transmitter comprising an optical communications laser, said laser comprising an amplifying portion and a reflector portion,
    said reflector portion comprising first and second optical waveguides,
    said first waveguide being designed for optical input and optical output,
    said second waveguide being in side-by-side optical coupling relationship with said first waveguide,
    said second waveguide comprising first and second sections in which effective refractive index varies in a spatially periodic fashion,
    whereby said second waveguide is adapted as a resonator for radiation at a desired wavelength traveling in said first waveguide.

19. The method of claim 18, said method comprising monitoring radiation in said first waveguide.

20. The method of claim 18, said method comprising controlling refractive index in at least a part of said laser.

21. The method of claim 20, said method comprising temperature control.

22. The method of claim 21, said method comprising temperature control of said amplifying portion.

23. The method of claim 20, said method comprising temperature control of at least a portion of said reflector portion.

* * * * *